US011267021B2

United States Patent
Dobashi et al.

(10) Patent No.: US 11,267,021 B2
(45) Date of Patent: Mar. 8, 2022

(54) GAS CLUSTER PROCESSING DEVICE AND GAS CLUSTER PROCESSING METHOD

(71) Applicants: TOKYO ELECTRON LIMITED, Tokyo (JP); IWATANI CORPORATION, Osaka (JP)

(72) Inventors: Kazuya Dobashi, Nirasaki (JP); Takehiko Orii, Nirasaki (JP); Yukimasa Saito, Nirasaki (JP); Kunihiko Koike, Hyogo (JP); Takehiko Senoo, Hyogo (JP); Koichi Izumi, Hyogo (JP); Yu Yoshino, Hyogo (JP); Tadashi Shojo, Hyogo (JP); Keita Kanehira, Hyogo (JP)

(73) Assignees: TOKYO ELECTRON LIMITED, Tokyo (JP); IWATANI CORPORATION, Osaka (JP)

( * ) Notice: Subject to any disclaimer, the term of this patent is extended or adjusted under 35 U.S.C. 154(b) by 112 days.

(21) Appl. No.: 16/496,714

(22) PCT Filed: Feb. 9, 2018

(86) PCT No.: PCT/JP2018/004669
§ 371 (c)(1),
(2) Date: Sep. 23, 2019

(87) PCT Pub. No.: WO2018/173541
PCT Pub. Date: Sep. 27, 2018

(65) Prior Publication Data
US 2021/0107041 A1    Apr. 15, 2021

(30) Foreign Application Priority Data
Mar. 23, 2017   (JP) .............................. JP2017-057086

(51) Int. Cl.
*H01L 21/67* (2006.01)
*B08B 5/02* (2006.01)
(Continued)

(52) U.S. Cl.
CPC .............. *B08B 5/02* (2013.01); *B08B 7/0035* (2013.01); *H01L 21/67028* (2013.01); *H01L 21/02057* (2013.01)

(58) Field of Classification Search
None
See application file for complete search history.

(56) References Cited

U.S. PATENT DOCUMENTS 6,478,040 B1 * 11/2002 Kikuchi ................ F17C 13/045
137/1
2015/0255316 A1 * 9/2015 Dobashi .............. H01L 21/0209
134/37

FOREIGN PATENT DOCUMENTS

JP        200127400 A    1/2001
JP        2003247469 A    9/2003
(Continued)

*Primary Examiner* — Nicole Blan
(74) *Attorney, Agent, or Firm* — Nath, Goldberg & Meyer; Jerald L. Meyer; Tanya E. Harkins

(57) ABSTRACT

There is provided a gas cluster processing device for performing a predetermined process on a workpiece by irradiating the workpiece with a gas cluster, including: a processing container in which the workpiece is disposed; a gas supply part configured to supply a gas for generating the gas cluster; a flow rate controller configured to control a flow rate of the gas supplied from the gas supply part; a cluster nozzle configured to receive the gas for generating the gas cluster at a predetermined supply pressure, spray the gas into the processing container maintained in a vacuum state, and convert the gas into the gas cluster through an adiabatic expansion; and a pressure control part provided in a pipe between the flow rate controller and the cluster nozzle and (Continued)

including a back pressure controller configured to control a supply pressure of the gas for generating the gas cluster.

6 Claims, 9 Drawing Sheets

(51) Int. Cl.
 _B08B 7/00_ (2006.01)
 _H01L 21/02_ (2006.01)

(56) References Cited

FOREIGN PATENT DOCUMENTS

| | | |
|---|---|---|
| JP | 200461321 A | 2/2004 |
| JP | 2006500741 A | 1/2006 |
| JP | 2008288530 A | 11/2008 |
| JP | 2010164130 A | 7/2010 |
| JP | 2013175681 A | 9/2013 |
| KR | 10-2010-0039850 A | 4/2010 |
| WO | 2011140200 A1 | 11/2011 |
| WO | 2014049959 A1 | 4/2014 |

* cited by examiner

GAS CLUSTER PROCESSING DEVICE AND GAS CLUSTER PROCESSING METHOD

CROSS-REFERENCE TO RELATED APPLICATIONS

This application is a 35 U.S.C § 371 national stage filling of International Application No. PCT/JP2018/004669, filed Feb. 9, 2018, the entire contents of which are incorporated by reference herein, which claims priority to Japanese Patent Application No. 2017-057086, filed on Mar. 23, 2017, the entire contents of which are incorporated by reference herein.

TECHNICAL FIELD

The present disclosure relates to a gas cluster processing device and a gas cluster processing method.

BACKGROUND

In the process of manufacturing a semiconductor device, particles adhering to a substrate cause product defects. Thus, a cleaning process is performed to remove the particles adhering to the substrate. As a technique for performing such a substrate cleaning process, a technique of irradiating the surface of the substrate with a gas cluster to remove particles adhering to the surface of the substrate by virtue of the physical action of the gas cluster has attracted attention.

As a technique for irradiating a substrate surface with a gas cluster, there is known a technique which includes spraying a cluster generation gas, such as $CO_2$, from a nozzle in a vacuum while keeping the gas at a high pressure, generating a gas cluster by adiabatic expansion, ionizing the generated gas cluster in an ionization part, accelerating the ionized gas cluster by an acceleration electrode, and irradiating the substrate with a gas cluster ion beam formed by the acceleration (see, for example, Patent Document 1).

Further, there is known a technique which includes spraying a plurality of gases including a cluster generation gas such as $CO_2$ and an acceleration gas such as He from a nozzle in a vacuum and irradiating a substrate with a neutral gas cluster generated by adiabatic expansion (see, for example, Patent Document 2).

The diameter of the gas cluster irradiated from the nozzle is determined by a supply pressure of the gas. Thus, it is necessary to control the gas supply pressure. As disclosed in Patent Documents 1 and 2, the gas supply pressure has been mainly controlled based on the supply flow rate of the gas. That is to say, since the gas supply pressure and the gas supply flow rate are in a proportional relationship with each other, it is possible to control the gas supply pressure by controlling the gas supply flow rate. In addition, as disclosed in Patent Document 2, fine adjustment of the supply pressure is performed using a pressure adjustment valve.

PRIOR ART DOCUMENT

Patent Documents

Patent Document 1: Japanese Laid-Open Patent Publication No. 2006-500741
Patent Document 2: Japanese Laid-Open Patent Publication No. 2013-175681

The gas supply flow rate is controlled using a mass flow controller (which obtains a temperature change proportional to a mass flow rate of a gas in an inner flow path, converts the temperature change into an electric signal, and operates a flow rate control valve based on an electric signal corresponding to an externally set flow rate to control the gas supply flow rate to the set flow rate). In the flow rate control using the mass flow controller, it takes a long period of time to reach the set pressure. When it is attempted to shorten a period of time taken to reach the set supply pressure by increasing the gas supply amount to be more than a supply amount corresponding to the set supply pressure, the supply pressure overshoots with respect to a pressure set by the pressure adjustment valve, which degrades a pressure controllability. In addition, when such an overshoot occurs, a pressure at the downstream side of the mass flow controller is increased so that a difference in pressure between front and back sides of the mass flow controller is not obtained. This makes it difficult to perform the control of the gas supply amount itself.

Therefore, the present disclosure provides a technique that is capable of reaching a gas supply pressure required for generating a gas cluster in a short period of time when irradiating a substrate with the gas cluster to perform a process on the substrate, and controlling the gas supply pressure with enhanced controllability.

SUMMARY

According to a first aspect of the present disclosure, there is provided a gas cluster processing device for performing a predetermined process on a workpiece by irradiating the workpiece with a gas cluster, including: a processing container in which the workpiece is disposed; a gas supply part configured to supply a gas for generating the gas cluster; a flow rate controller configured to control a flow rate of the gas supplied from the gas supply part; a cluster nozzle configured to receive the gas for generating the gas cluster at a predetermined supply pressure, spray the gas into the processing container maintained in a vacuum state, and convert the gas into the gas cluster through an adiabatic expansion; and a pressure control part provided in a pipe between the flow rate controller and the cluster nozzle and including a back pressure controller configured to control a supply pressure of the gas for generating the gas cluster.

The pressure control part includes a branch pipe branched from the pipe. The back pressure controller is provided in the branch pipe and is configured to exhaust the gas from the pipe therethrough. A primary-side pressure of the back pressure controller is set to the predetermined supply pressure. It is possible to exhaust excess gas through the back pressure controller when the primary-side pressure reaches the predetermined supply pressure.

The back pressure controller includes a first back pressure controller and a second back pressure controller which are provided in the branch pipe in a serial manner. A high-precision back pressure controller having a relatively narrow pressure difference range is used as the first back pressure controller. A primary-side pressure of the first back pressure controller may be set to be a set value of the gas supply pressure. A back pressure controller having a pressure difference range wider than the pressure difference range of the first back pressure controller is used as the second back pressure controller. A primary-side pressure of the second back pressure controller may be set to be lower than the set value of the gas supply pressure.

The gas cluster processing device may further include a controller configured to control a set flow rate of the flow rate controller. The controller controls the set flow rate of the flow rate controller to a first flow rate exceeding a flow rate required for reaching the predetermined supply pressure until the supply pressure of the gas supplied from the gas supply part reaches the predetermined supply pressure. The pressure control part may include a flowmeter configured to measure a flow rate of a gas flowing through the back pressure controller. The controller may control, based on the measured value obtained by the flowmeter, the set value of the flow rate controller to a second flow rate which is greater than a flow rate enough to maintain the predetermined supply pressure and less than the first flow rate.

The gas supply part may be configured to separately supply at least two types of gases as the gas for generating the gas cluster. The flow rate controller may include at least two flow rate controllers provided respectively to correspond to the at least two types of gases. The at least two types of gases may be joined in the pipe at downstream sides of the at least two flow rate controllers. The pressure control part may be provided in a portion of the pipe in which the at least two types of gases are joined.

The gas cluster processing device may further include a booster provided at an upstream side of a portion of the pipe in which the pressure control part is provided, the booster being configured to increase a pressure of the gas for generating the gas cluster. Further, the pressure control part may further include a bypass flow path provided to bypass the back pressure controller from the pipe, and an opening/closing valve configured to open/close the bypass flow path. After the gas cluster is processed, the opening/closing valve may be opened to exhaust the gas remaining in the cluster nozzle and the pipe through the bypass flow path. The gas cluster processing device may further include a temperature adjusting part provided at the downstream side of the branch pipe in which the pressure control part is disposed and configured to adjust the temperature of the gas remaining in the cluster nozzle and existing at the upstream side of the cluster nozzle. The flow rate controller may be a mass flow controller.

The first flow rate may be controlled to fall within a range of 1.5 times to 50 times the flow rate enough to maintain the predetermined supply pressure. The second flow rate may be controlled to fall within a range of 1.02 to 1.5 times the flow rate enough to maintain the predetermined supply pressure.

According to a second aspect of the present disclosure, there is provided a gas cluster processing method of performing a predetermined process on a workpiece by supplying a gas for generating a gas cluster to a cluster nozzle through a pipe, spraying the gas from the cluster nozzle into a processing container maintained in a vacuum state, converting the gas into the gas cluster by an adiabatic expansion, and irradiating the workpiece disposed inside the processing container with the gas cluster. The method includes controlling a flow rate of the gas to a predetermined flow rate, discharging a portion of the gas from the pipe, and controlling a supply pressure in the pipe to a predetermined supply pressure.

In the second aspect, the supply pressure may be controlled using a back pressure controller. In this case, the back pressure controller is provided in a branch pipe branched from the pipe such that the gas discharged from the pipe flows into the back pressure controller through the branch pipe. A primary-side pressure of the back pressure controller may be set to be the predetermined supply pressure. When the primary-side pressure reaches the predetermined supply pressure, an excess gas may be discharged through the back pressure controller. Further, the back pressure controller may include a first back pressure controller and a second back pressure controller which are provided in the branch pipe in a serial manner. A high-precision back pressure controller having a narrow pressure difference range may be used as the first back pressure controller. The primary-side pressure of the first back pressure controller may be set to be a set value of the gas supply pressure. A back pressure controller having a pressure difference range wider than the pressure difference range of the first back pressure controller may be used as the second back pressure controller. The primary-side pressure of the second back pressure controller may be set to be lower than the set value of the gas supply pressure.

The gas cluster processing method may further include: controlling a set flow rate of the flow rate controller to a first flow rate required for reaching the predetermined supply pressure until the supply pressure of the gas reaches the predetermined supply pressure; measuring a flow rate of the gas discharged from the pipe and flowing through the back pressure controller; and controlling, based on the measured flow rate, the flow rate of the gas to a second flow rate greater than a flow rate enough to maintain the predetermined supply pressure and less than the first flow rate. In the case, the first flow rate may be controlled to fall within a range of 1.5 times to 50 times the flow rate enough to maintain the predetermined supply pressure, and the second flow rate may be controlled to fall within a range of 1.02 to 1.5 times the flow rate enough to maintain the predetermined supply pressure.

According to the present disclosure, the flow rate of the gas supplied from the gas supply part is controlled by the flow rate controller. The gas supply pressure for generating the gas cluster in the pipe between the flow rate controller and a cluster nozzle is controlled by a pressure control part having a back pressure controller. Thus, by causing the gas for generating the gas cluster to flow at a large flow rate, it is possible to discharge excess gas when reaching a predetermined supply pressure, and it is possible to reach the predetermined gas supply pressure in a short period of time. In addition, as described above, since the excess gas is discharged when the predetermined supply pressure is reached, no overshoot occurs at the gas supply pressure, and since the gas supply pressure is maintained constant during the cleaning process by the back pressure controller, the controllability of the gas supply pressure is satisfactory.

DETAILED DESCRIPTION

Hereinafter, embodiments of the present disclosure will be described in detail with reference to the accompanying drawings.

First Embodiment

Figure 1:
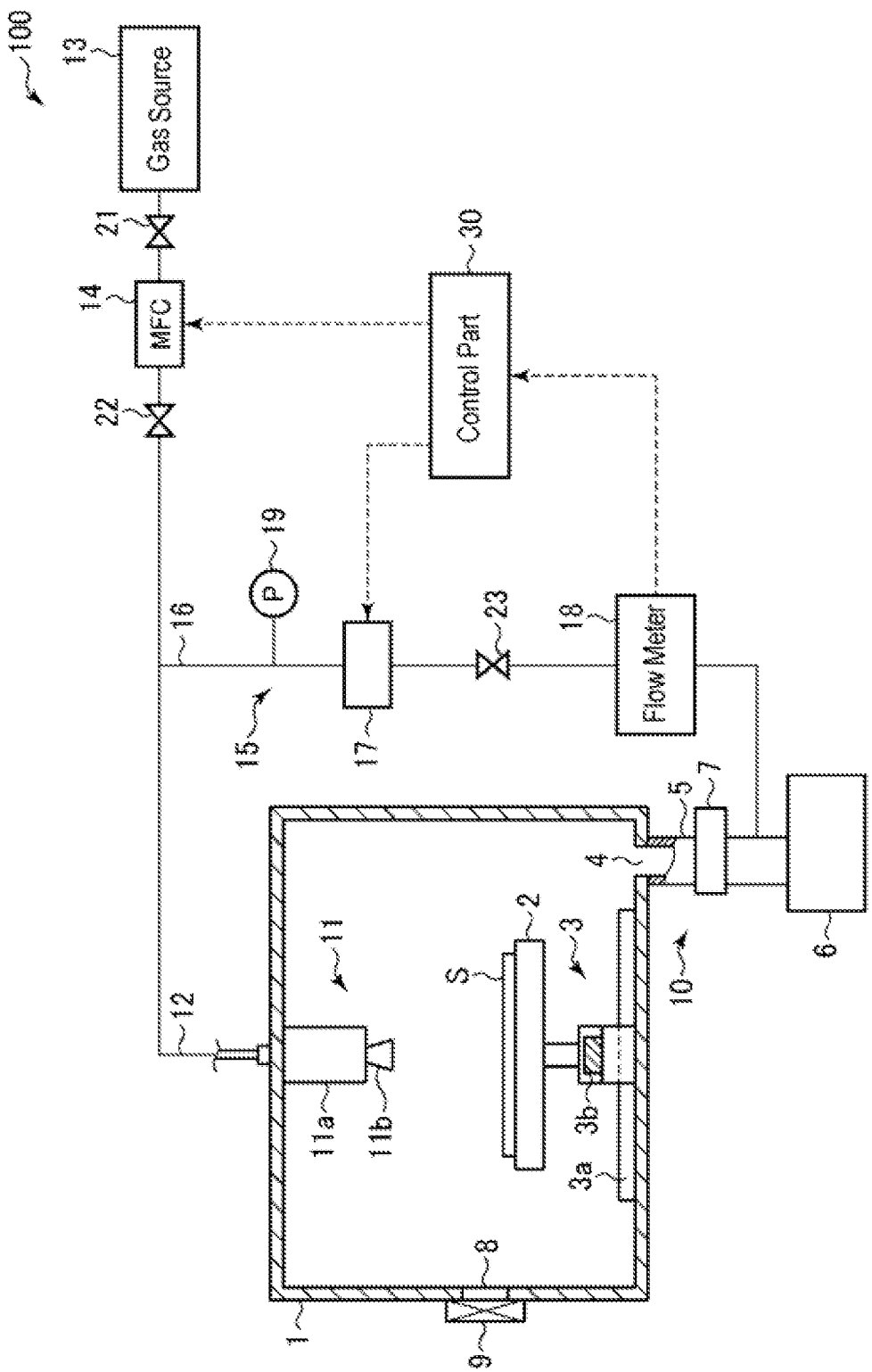
FIG. 1 is a cross-sectional view illustrating a gas cluster processing device according to a first embodiment of the present disclosure.

First, a first embodiment will be described. FIG. 1 is a cross-sectional view illustrating a gas cluster processing device according to a first embodiment of the present disclosure.

A gas cluster processing device 100 of the present embodiment is provided to perform a cleaning process on a surface of a workpiece by irradiating the surface of the workpiece with a gas cluster.

The gas cluster processing device 100 includes a processing container 1 that defines a processing chamber for performing the cleaning process. In the vicinity of the bottom portion in the processing container 1, a substrate stage 2 for placing a substrate S thereon is provided.

Examples of the substrate S may include various substrates such as a semiconductor wafer and a glass substrate for a flat panel display, and are not particularly limited.

In the upper portion of the processing container 1, a cluster nozzle 11 for irradiating a gas cluster towards the substrate S is provided to face the substrate stage 2. The cluster nozzle 11 includes a main body 11a and a conical tip 11b. An orifice having a diameter of, for example, about 0.1 mm is provided between the main body 11a and the tip 11b.

The substrate stage 2 is driven by a drive part 3. When the substrate stage 2 is driven by the drive part 3, relative movement occurs between the substrate S and the cluster nozzle 11. The drive part 3 is configured as an XY table including an X-axis rail 3a and a Y-axis rail 3b. The cluster nozzle 11 may be driven in a state where the substrate stage 2 is fixedly provided.

An exhaust port 4 is formed in the bottom portion of the processing container 1. An exhaust pipe 5 is connected to the exhaust port 4. A vacuum pump 6 is provided in the exhaust pipe 5. The interior of the processing container 1 is evacuated by the vacuum pump 6. A degree of vacuum at the time of the evacuation may be controlled by a pressure control valve 7 provided in the exhaust pipe 5. A combination of the exhaust pipe 5, the vacuum pump 6, and the pressure control valve 7 constitutes an exhaust mechanism 10. The interior of the processing container 1 is maintained at a predetermined degree of vacuum of, for example, 0.1 to 300 Pa, by the exhaust mechanism 10.

A loading/unloading port 8 through which the substrate S is loaded and unloaded is formed on the side surface of the processing container 1. The processing container 1 is connected to a vacuum transfer chamber (not illustrated) through the loading/unloading port 8. The loading/unloading port 8 is opened/closed by a gate valve 9. The loading/unloading of the substrate S with respect to the processing container 1 is performed by a substrate transfer device (not illustrated) inside the vacuum transfer chamber.

The cluster nozzle 11 is connected to one end of a gas supply pipe 12 which penetrates through a ceiling wall of the processing container 1 to supply a cluster generation gas, which is a gas for generating a gas cluster inside the cluster nozzle 11. The other end of the pipe 12 is connected to a gas source 13 that supplies the gas. The gas supply pipe 12 is provided with a mass flow controller 14, which is a flow rate controller for controlling a supply flow rate of the cluster generation gas.

A pressure control part 15 is provided between the mass flow controller 14 and the cluster nozzle 11 to control a supply pressure of the gas to be supplied to the cluster nozzle 11.

The pressure control part 15 includes a branch pipe 16 branched at a portion between the mass flow controller 14 and the cluster nozzle 11 in the gas supply pipe 12, a back pressure controller 17 provided in the branch pipe 16, and a flowmeter 18 for measuring a flow rate of the gas flowing through the branch pipe 16. The other end of the branch pipe 16 is connected to the exhaust pipe 5. A pressure gauge 19 is provided at the upstream side of the back pressure controller 17 in the branch pipe 16. The back pressure controller 17 has a function of controlling a pressure at the primary side, namely the upstream side of the back pressure controller 17, to a constant value. Specifically, the back pressure controller 17 includes a relief valve. When the primary-side pressure reaches a set pressure, the relief valve is opened to exhaust excess gas, so that the gas supply pressure is maintained at a constant pressure. The back pressure controller 17 may be any back pressure controller as long as it is controlled in a difference pressure manner such that the primary-side pressure becomes the supply pressure of the gas supplied to the cluster nozzle 11, for example, 0.9 MPa. The pressure gauge 19 monitors a pressure at the upstream side of the back pressure controller 17. The flowmeter 18 is installed at the downstream side of the back pressure controller 17. However, the installation position of the flowmeter 18 is not particularly limited as long as it is capable of measuring the flow rate of the gas flowing through the branch pipe 16.

Opening/closing valves 21 and 22 are provided at front and back sides of the mass flow controller 14 in the gas supply pipe 12, respectively. An opening/closing valve 23 is provided at the downstream side of the back pressure controller 17 in the branch pipe 16.

The supply pressure of the cluster generation gas to be supplied from the gas source 13 to the cluster nozzle 11 is controlled by the pressure control part 15 to a high pressure of, for example, 0.3 to 5.0 MPa. When the cluster generation gas supplied from the gas source 13 is sprayed from the cluster nozzle 11 into the processing container 1 maintained in a vacuum state of, for example, 0.1 to 300 Pa, the supplied gas is adiabatically expanded so that some (several to about $10^7$) atoms or molecules of the gas are aggregated by virtue of van der Waals force to form a gas cluster.

The cluster generation gas is not particularly limited. As an example, a gas capable of generating clusters, such as a $CO_2$ gas, an Ar gas, an $N_2$ gas, an $SF_6$ gas, a $CF_4$ gas or the like, may be suitably used. A plurality of cluster generation gases may be mixed with each other and supplied. In addition, an $H_2$ gas or an He gas for cluster acceleration may be mixed with the cluster generation gas.

In order to spray the generated gas cluster onto the substrate S without destroying the generated gas cluster, an internal pressure of the processing container 1 may be set at a low level. For example, when the supply pressure of the gas supplied to the cluster nozzle 11 is 1 MPa or lower, the internal pressure of the processing container 1 may be 100 Pa or lower, and when the supply pressure is 1 to 5 MPa, the internal pressure of the processing container 1 may be 1,000 Pa or less.

The gas cluster processing device 100 includes a control part 30. The control part 30 controls respective components (e.g., the valves, the mass flow controller, the back pressure controller, and the drive part) of the gas cluster processing device 100. In particular, the control part 30 sends a command to set a pressure to the back pressure controller 17, and performs the flow control of the mass flow controller 14 based on the measured flow rate of the flowmeter 18.

Next, a processing operation of the gas cluster processing device 100 configured as above will be described. The gate valve 9 is opened, and the substrate S is loaded from the vacuum transfer chamber through the loading/unloading port 8 into the processing container 1 that is being continuously evacuated by the vacuum pump 6. The substrate S is placed on the substrate stage 2. Thereafter, the gate valve 9 is closed and the internal pressure of the processing container 1 is controlled to a predetermined pressure by the pressure control valve 7.

Figure 2:
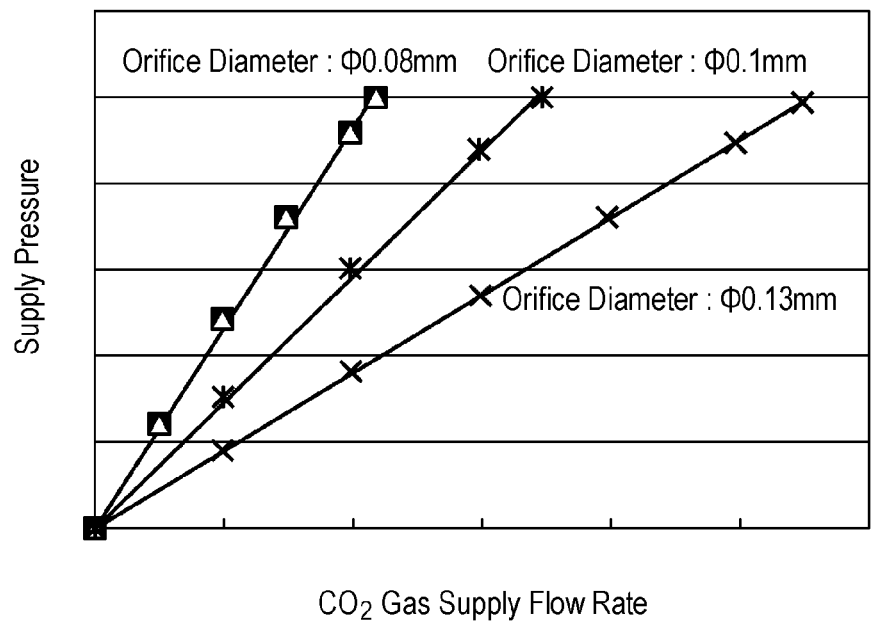
FIG. 2 is a view representing the relationship between a gas supply pressure and a gas supply flow rate.

Thereafter, the gas cluster generation gas is supplied to the cluster nozzle 11 at a predetermined supply pressure. Conventionally, the control of the gas supply pressure at this time has been performed by controlling the gas supply flow rate using a mass flow controller. As illustrated in FIG. 2, the gas supply pressure and the gas supply flow rate is in a proportional relationship. The proportional relationship depends on a diameter of the orifice of the cluster nozzle. In addition, a fine adjustment of the gas supply pressure has been performed by a pressure control valve (regulator) provided at the downstream side of the mass flow controller.

Figure 3:
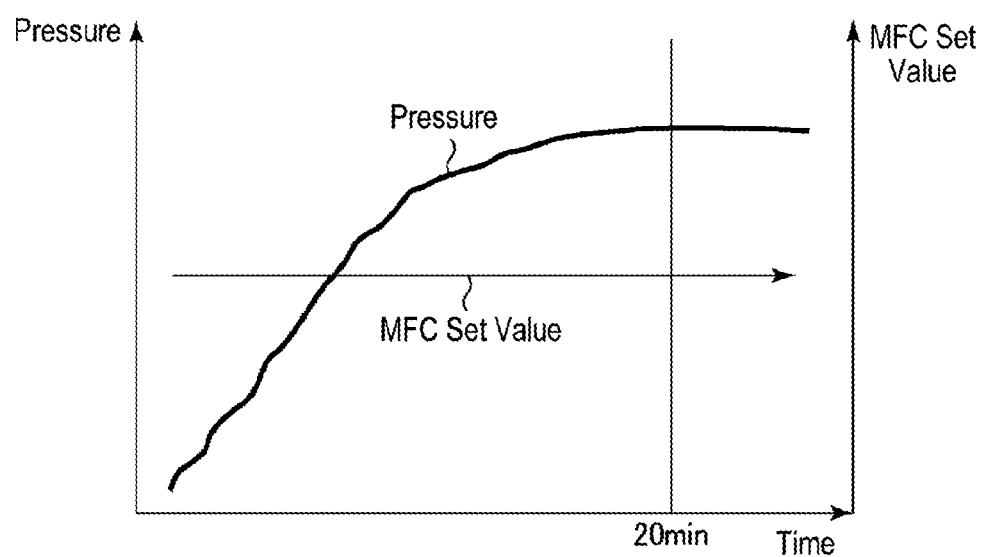
FIG. 3 is a view representing a time-dependent change in supply pressure in a conventional case in which a gas supply pressure is controlled using a gas supply flow rate.

However, in the case where the gas supply pressure is controlled by the gas supply flow rate, even if the gas supply flow rate of the mass flow controller is set to obtain a predetermined gas supply pressure, since the pressure is increased in a state in which the gas flows out from the orifice of the cluster nozzle, it takes a time period until an amount of the gas flowing out of the orifice and an amount of the supplied gas are stabilized. Thus, as represented in FIG. 3, a time period taken to reach the set supply pressure is prolonged. For example, when the pressure is increased up to 0.9 MPa using a $CO_2$ gas as the cluster generation gas, it takes a time period of 15 minutes or more.

Figure 4:
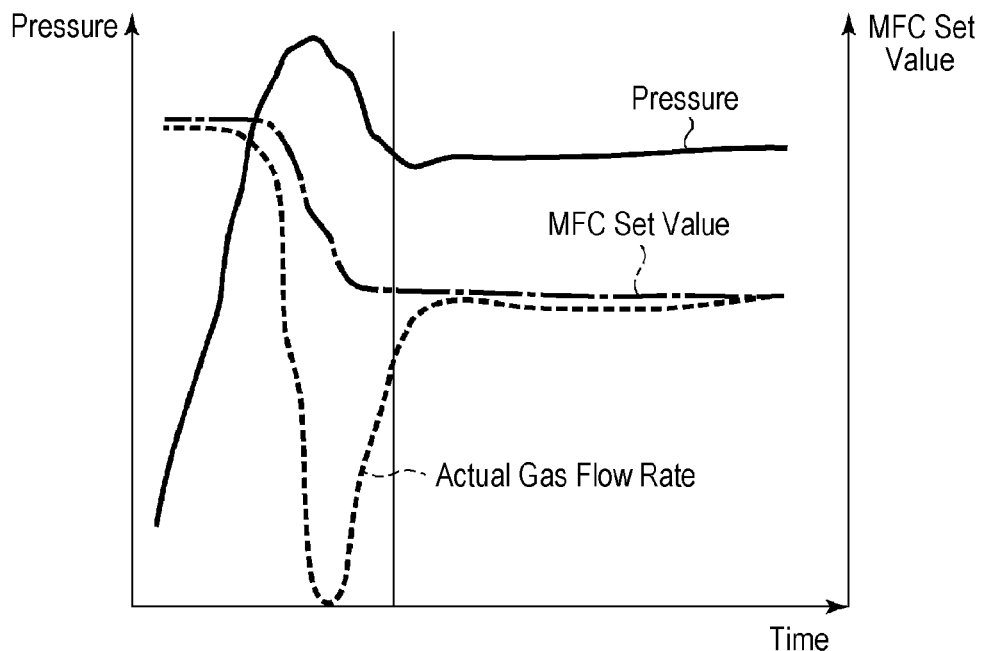
FIG. 4 is a view representing a time-dependent change in pressure when a gas supply amount is increased to be more than a supply amount corresponding to a set supply pressure in the conventional case in which the gas supply pressure is controlled by the gas supply flow rate.

Meanwhile, when it is attempted to shorten the time period to reach the set supply pressure by increasing the gas supply amount to be more than the supply amount corresponding to the set supply pressure, the time period to reach the set supply pressure is shortened compared to the prior art. However, as illustrated in FIG. 4, with respect to a desired set pressure, the supply pressure overshoots, which may result in a degradation in pressure controllability. In addition, when such an overshoot occurs, the pressure at the downstream side of the mass flow controller is increased so that a difference in pressure at the front and back sides of the mass flow controller is not obtained. This makes it difficult to control the gas supply flow rate. Even if a pressure control valve (regulator) for fine adjustment of the gas supply pressure is provided at the downstream side of the mass flow controller, the pressure at the downstream side of the mass flow controller is increased similarly. This makes it difficult to obtain the difference in pressure at the front and back sides of the mass flow controller, and difficult to control the gas supply flow rate.

Therefore, in the present embodiment, in order to eliminate such a problem, the control of the gas supply pressure of the cluster generation gas is performed using the pressure control part 15 equipped with the back pressure controller 17.

Figure 5:
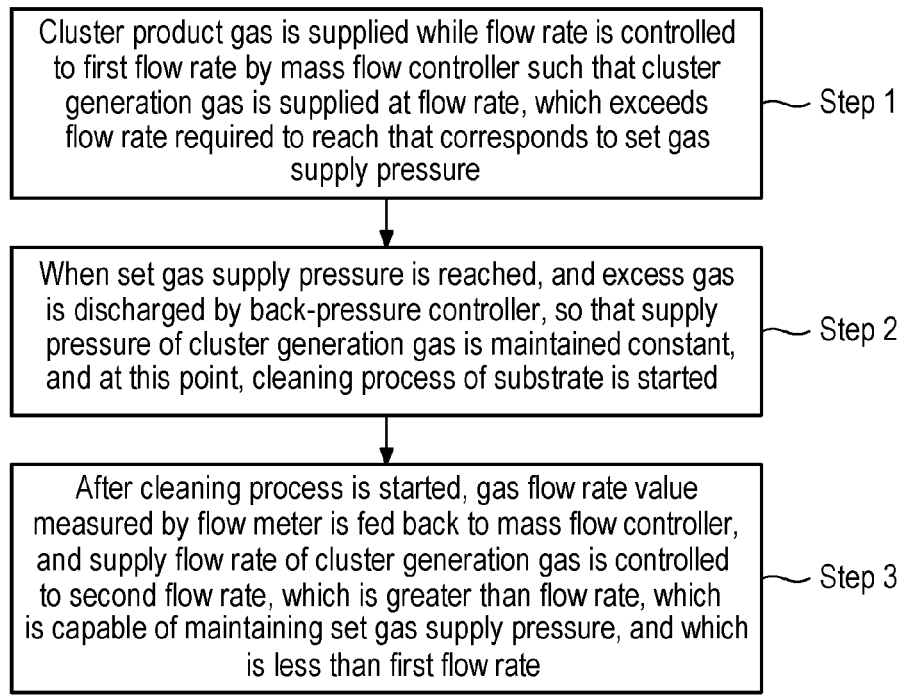
FIG. 5 is a flow chart illustrating an example of a gas supply pressure controlling method of the present disclosure.

Next, an example of a gas supply pressure controlling method will be described with reference to a flowchart of FIG. 5. First, a cluster generation gas is supplied at a first flow rate controlled by the mass flow controller 14 such that the cluster generation gas is supplied at a flow rate which exceeds a flow rate required to reach a set gas supply pressure (step 1).

When the pressure reaches the set gas supply pressure, the relief valve of the back pressure controller 17 is opened to discharge excess gas through the branch pipe 16. The supply pressure of the cluster generation gas supplied to the cluster nozzle 11 through the gas supply pipe 12 is maintained constant. At this time, the cleaning process of the substrate S begins (step 2).

After the cleaning process begins, a gas flow rate value of the branch pipe 16, which is measured by the flowmeter 18, is fed back to the mass flow controller 14. The supply flow rate of the cluster generation gas is controlled to a second flow rate, which is greater than a flow rate at which the set gas supply pressure can be maintained, and which is less than the first flow rate (step 3).

As described above, the gas supply pressure itself is controlled by providing the back pressure controller 17 in the pressure control part 15 configured to control the supply pressure of the cluster generation gas. Thus, even if the cluster generation gas is supplied at a large flow rate by the setting of the mass flow controller 14, it is possible to discharge excess gas through the back pressure controller 17 when the supply pressure reaches the set gas supply pressure, thereby controlling the gas supply pressure to the set gas supply pressure. Therefore, it is possible to supply the cluster generation gas at a large flow rate, thus allowing the gas supply pressure to reach the set gas supply pressure in a short period of time. For example, when the gas supply pressure is 0.9 MPa, it taken a time period of 15 minutes or more until the set gas supply pressure is reached and stabilized from the start of the gas supply. In the present embodiment, however, it is possible to shorten the time period to 4 minutes or less.

In addition, since the excess gas is discharged when the gas supply pressure reaches the set pressure in step 2, no overshoot occurs at the gas supply pressure. In addition, since the gas supply pressure is maintained constant during the cleaning process by the back pressure controller 17, the controllability of the gas supply pressure is good.

Furthermore, after the cleaning process is started, it is possible to measure the flow rate of the gas flowing through the branch pipe 16 as the excess gas using the flowmeter 18, and to control the flow rate of the cluster generation gas based on the measured value. Thus, it is possible to reduce the amount of redundant gas that does not contribute to the generation of the gas cluster.

Second Embodiment

Next, a second exemplary embodiment will be described.

Figure 6:
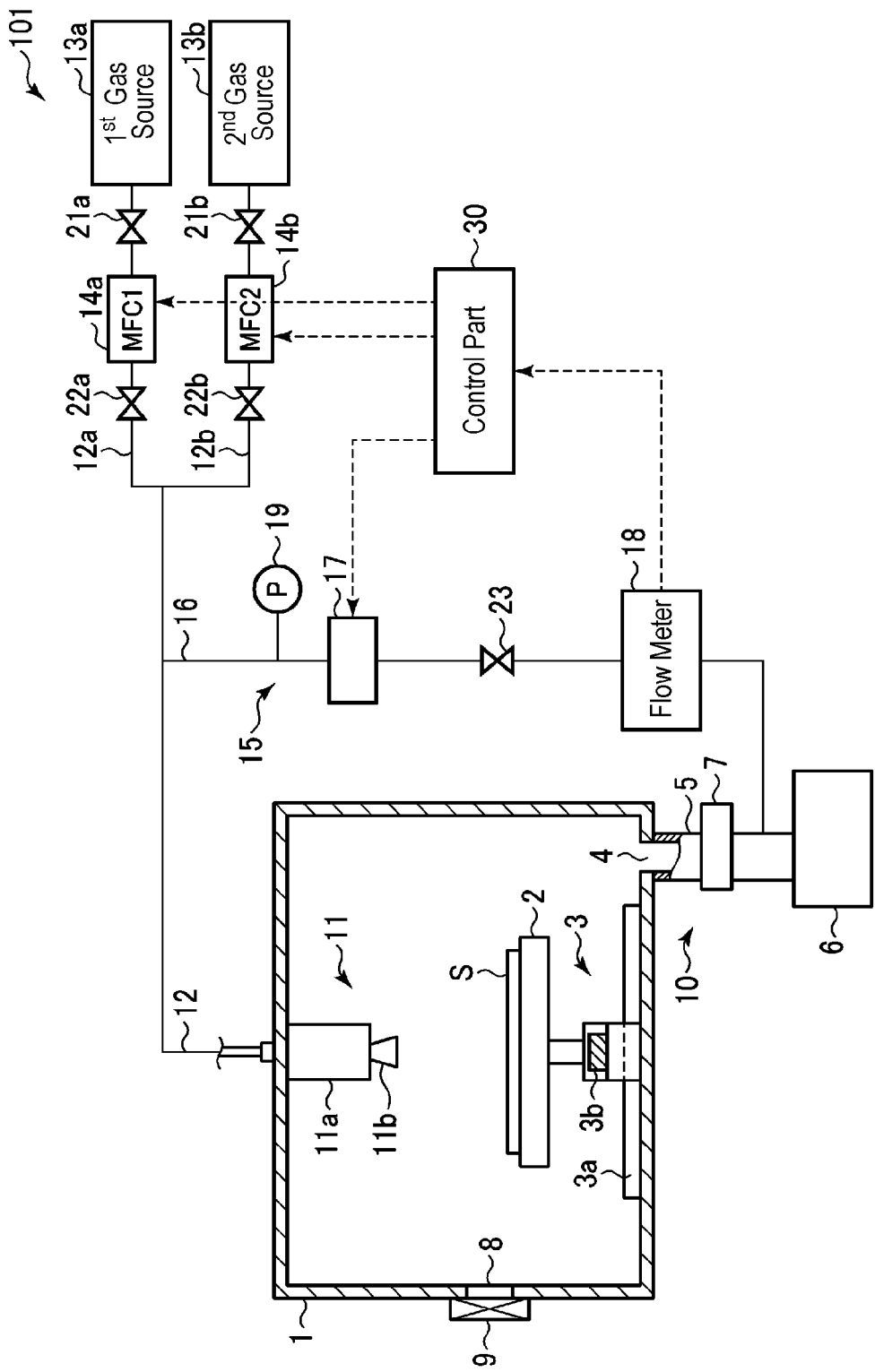
FIG. 6 is a cross-sectional view illustrating a gas cluster processing device according to a second embodiment of the present disclosure.

FIG. 6 is a cross-sectional view illustrating a gas cluster processing device according to the second embodiment of the present disclosure.

The basic configuration of a gas cluster processing device 101 according to the second embodiment is similar to that in the first embodiment shown in FIG. 1, except that the gas cluster processing device 101 supplies at least two types of gases as the gas cluster generation gas.

In the present embodiment, at least two types of gases, which include at least one type of cluster generation gas, are separately supplied as gases for generating a gas cluster. For example, two or more types of cluster generation gases, such as the $CO_2$ gas, the Ar gas, the $N_2$ gas, the $SF_6$ gas, and the $CF_4$ gas described above, may be separately supplied. In some embodiments, the cluster generation gas and an acceleration gas for accelerating the cluster generation gas may be supplied individually. The acceleration gas is used when it is impossible to obtain a required speed using the cluster generation gas alone. The acceleration gas alone is hard to generate a cluster, but has an action of accelerating a gas cluster generated by the cluster generation gas. As the acceleration gas, an He gas, an $H_2$ gas, or the like may be used. Other gases such as a reaction gas that causes a predetermined reaction on the surface of the substrate S may be used.

In the embodiment of FIG. 6, there is shown the case in which two types of gases are supplied using a first gas source 13a configured to supply a first gas and a second gas source 13b configured to supply a second gas. Specifically, the case in which the first gas supplied from the first gas source 13a is the $CO_2$ gas as a cluster generation gas, and the second gas supplied from the second gas source 13b is the $H_2$ gas or the He gas as an acceleration gas, is illustrated as an example. The first gas or the second gas may be a mixture of a plurality of gases.

A first pipe 12a is connected to the first gas source 13a, and a second pipe 12b is connected to the second gas source 13b. The first pipe 12a and the second pipe 12b are connected to the gas supply pipe 12 extending from the cluster nozzle 11. The first gas and the second gas, which are respectively supplied from the first gas source 13a and the second gas source 13b, are joined in the gas supply pipe 12 after passing through the first pipe 12a and the second pipe 12b. The first gas and the second gas thus joined are supplied to the cluster nozzle 11. The first pipe 12a is provided with a first mass flow controller (MFC1) 14a, which is a flow rate controller configured to control a supply flow rate of the first gas. The second pipe 12b is provided with a second mass flow controller (MFC2) 14b, which is a flow rate controller configured to control a supply flow rate of the second gas.

In a case where three or more types of gases are supplied, gas sources, pipes, and mass flow controllers may be further provided depending on the number of the gases.

Like the gas cluster processing device 100 of the first embodiment illustrated in FIG. 1, the gas cluster processing device 101 of the second embodiment also includes a pressure control part 15. The pressure control part 15 is provided between the first mass flow controller 14a and the second mass flow controller 14b and the cluster nozzle 11, and includes a branch pipe 16 branched from the gas supply pipe 12, a back pressure controller 17 provided in the branch pipe 16, and a flowmeter 18 configured to measure a flow rate of the gas flowing through the branch pipe 16. An opening/closing valve 23 is provided at the downstream side of the back pressure controller 17 in the branch pipe 16 as in the first embodiment.

The first pipe 12a is provided with opening/closing valves 21a and 22b at front and back sides of the first mass flow controller 14a. The second pipe 12b is provided with opening/closing valves 21b and 22b at front and back sides of the second mass flow controller 14b.

The gas cluster processing device 101 of the present embodiment also includes a control part 30 that controls respective components (e.g., the valves, the mass flow controllers, the back pressure controller, and the drive part) similarly to the gas cluster processing device 100 of the first embodiment. In the present embodiment, the control part 30 gives a command to set a pressure to the back pressure controller 17, and performs the flow rate controls of the first mass flow controller 14a and the second mass flow controller 14b based on the flow rates measured by the flowmeter 18.

Other components are the same as those of the gas cluster processing device 100 of the first embodiment, and thus a description thereof will be omitted.

Next, a processing operation of the gas cluster processing device 101 configured as above will be described.

Like the first embodiment, the gate valve 9 is opened and the substrate S is loaded from the vacuum transfer chamber through the loading/unloading port 8 into the processing container 1 which is being continuously evacuated by the vacuum pump 6. The substrate S is placed on the substrate stage 2. Thereafter, the gate valve 9 is closed and the internal pressure of the processing container 1 is controlled to a predetermined pressure by the pressure control valve 7.

Thereafter, at least two types of gases, which include at least one type of cluster generation gas, are supplied to the gas cluster nozzle 11 as gases for generating a gas cluster. In the embodiment of FIG. 6, the first gas and the second gas are supplied from the first gas source 13a and the second gas source 13b, respectively.

As described above, the method of controlling the gas supply pressure by controlling the gas supply flow rate using the conventional mass flow controller when multiple types of gases are supplied has a problem in that a gas ratio may become unstable, in addition to the problems that the time period taken to reach the set supply pressure is prolonged and the controllability of the supply pressure is poor, as described above.

That is to say, as illustrated in FIG. 4 described above, when the supply pressure overshoots, the pressure at the downstream side of the mass flow controller is increased, and the difference in pressure between the front and back sides of the mass flow controller is not obtained. This makes it difficult to control the gas supply flow rate, and thus difficult to maintain a ratio of the multiple types of gases at a set ratio.

For example, in the case in which the $CO_2$ gas is used as a cluster generation gas and the He gas or the $H_2$ gas is used as an acceleration gas, when the ratio of these gases deviates from the set ratio and the ratio of $CO_2$ becomes extremely high, a partial pressure of $CO_2$ may be increased in the cluster nozzle 11, which causes liquefaction in some cases. When the liquefaction of $CO_2$ occurs, a large cluster may be generated, which damages a pattern on the substrate S.

In contrast, in the present embodiment, the first gas supplied from the first gas source 13a is controlled by the first mass flow controller 14a, and the second gas supplied from the second gas source 13b is controlled by the second mass flow controller 14b. Thus, each of the first gas and the second gas is supplied at a predetermined ratio and at a flow rate exceeding an amount required to reach the set gas supply pressure. Further, the first gas and the second gas are supplied to the cluster nozzle 11 after being controlled to have the set supply pressure by the back pressure controller 17. Thus, it is possible to allow the gas supply pressure to reach the set gas supply pressure in a short period of time and to control the gas supply pressure with good controllability without causing the overshoot of the gas supply pressure as in the first embodiment. Furthermore, it is possible to maintain the ratio of the first gas and the second gas at the set ratio without causing a state in which the mass flow controller is unable to control the flow rate due to the overshoot of the gas supply pressure. This holds true in the case where three or more types of gases are used.

As in the first embodiment, after the cleaning process begins, the flow rate of the gas flowing through the branch pipe 16 as excess gas is measured by the flowmeter 18. The measured value is fed back to each of the mass flow controllers 14a and 14b. This makes it possible to reduce the amount of redundant gas that does not contribute to the generation of a gas cluster while maintaining the gas ratio.

The first flow rate, which is the set flow rate of the flow rate controller, may be set in a range of 1.5 times to 50 times a flow rate at which the set supply pressure can be maintained. When the first flow rate falls within the range of 50 times, it is possible to perform the control in the same flow rate controller with high accuracy. When the first flow rate is in the range of 1.5 times to 5.0 times, it is possible to more accurately maintain the ratio of the first gas and the second gas without causing an extreme change in flow speed. Thus, the first flow rate may fall within the range of 1.5 times to 2.0 times. The second flow rate may be controlled in a range of 1.02 times to 1.5 times a flow rate at which the predetermined gas supply pressure can be maintained.

Third Embodiment

Next, a third embodiment will be described.

Figure 7:
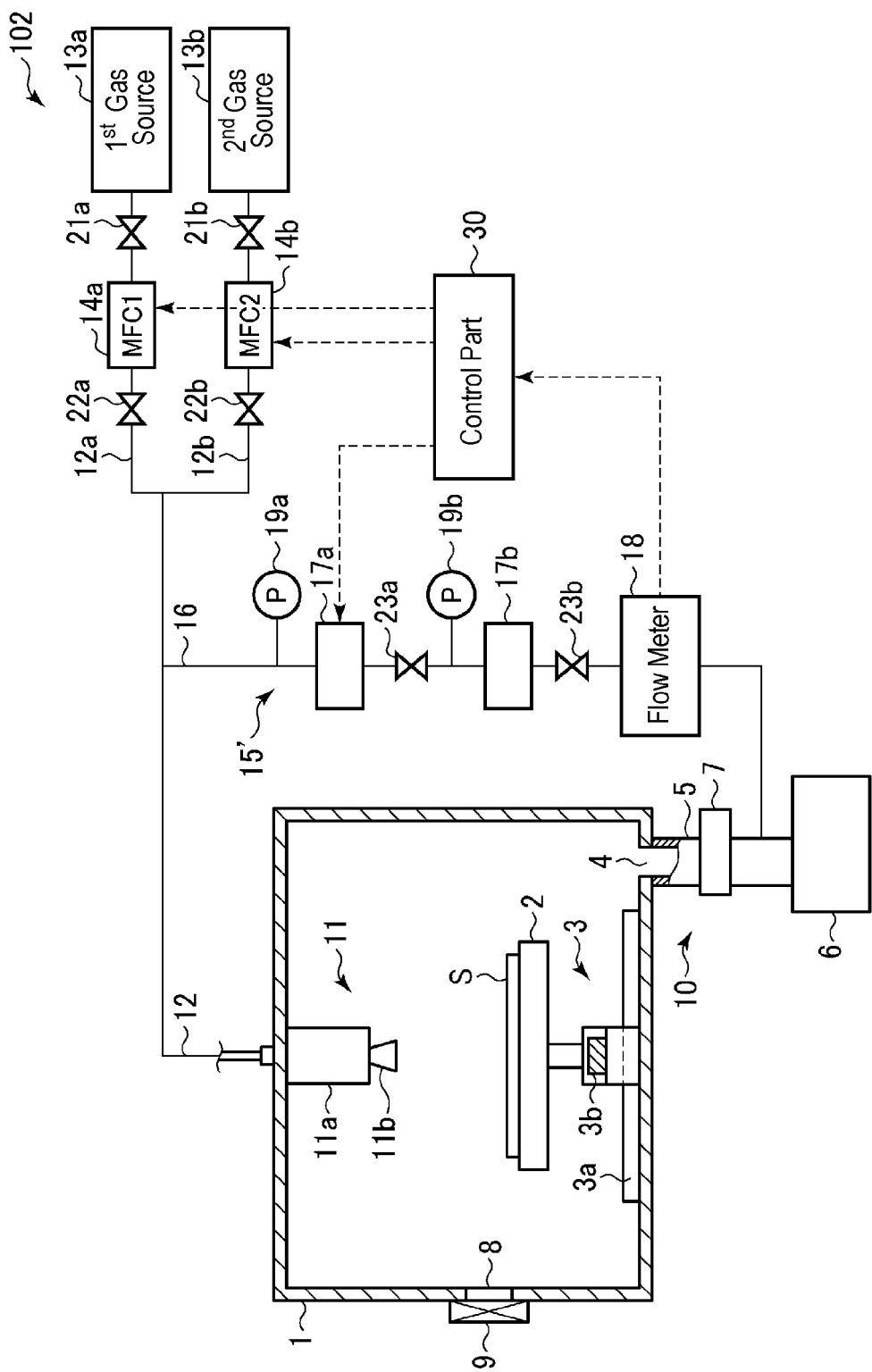
FIG. 7 is a cross-sectional view illustrating a gas cluster processing device according to a third embodiment of the present disclosure.

FIG. 7 is a cross-sectional view illustrating a gas cluster processing device according to the third embodiment of the present disclosure.

The basic configuration of a gas cluster processing device 102 of the third embodiment is the same as that of FIG. 6 of the second embodiment except that the gas cluster processing device 102 includes a pressure control part which is provided with two back pressure controllers arranged in series.

As illustrated in FIG. 7, in the gas cluster processing device 102 of the present embodiment, a pressure control part 15' includes a branch pipe 16 branched from the gas supply pipe 12 between the mass flow controllers 14a and 14b and the cluster nozzle 11, a first back pressure controller 17a provided in the branch pipe 16, a second back pressure controller 17b provided at the downstream side of the first back pressure controller 17a in the branch pipe 16, and the flowmeter 18 for measuring a flow rate of the gas flowing through the branch pipe 16. The other end of the branch pipe 16 is connected to the exhaust pipe 5. The position of the flowmeter 18 is not particularly limited as long as the flowmeter 18 can measure the flow rate flowing through the branch pipe 16. A first pressure gauge 19a is provided at the upstream side of the first back pressure controller 17a in the branch pipe 16, and a second pressure gauge 19b is provided at the upstream side of the second back pressure controller 17b in the branch pipe 16. The first pressure gauge 19a and the second pressure gauge 19b monitor pressures at respective positions in the branch line 16. Opening/closing valves 23a and 23b are provided at the downstream sides of the first back pressure controller 17a and the second back pressure controller 17b in the branch pipe 16, respectively.

The first and second back pressure controllers 17a and 17b are serially arranged in the above manner. By setting a primary side of the second back pressure controller 17b provided at the downstream side is set to be maintained at a predetermined pressure and allowing the first back pressure controller 17a provided at the upstream side to control the gas supply pressure in the gas supply pipe 12, it is possible to further shorten a time period until the gas supply pressure reaches the set supply pressure from the start of the gas supply and is stabilized. That is to say, by using a high-precision back pressure controller having a relatively narrow difference in pressure range as the first back pressure controller 17a and by using a back pressure controller having a relatively wide difference in pressure range as the second back pressure controller 17b, it is possible to perform a cursory pressure control using the second back pressure controller 17b, and to perform the pressure within a narrow difference in pressure range using the first back pressure controller 17a. It is therefore possible to shorten the time until the gas supply pressure reaches the set supply pressure from the start of the gas supply and is stabilized, to a short period of time of 1 minute or less.

For example, by setting a primary-side pressure (gas supply pressure) of the first back pressure controller 17a to 0.9 MPa and a primary-side pressure of the second back pressure controller 17b to 0.75 MPa using an electronically-controlled 40.3 MPa-pressure difference (slight pressure difference) control type of back pressure controller as the first back pressure controller 17a, and a mechanically-controlled Δ1 MPa-pressure difference control type of back pressure controller as the second back pressure controller 17b, it is possible to reduce the time period until the gas supply pressure reaches the set supply pressure from the start of the gas supply and is stabilized, from about 4 minutes to about 15 to 20 seconds when using a single back pressure controller. In addition, the electronically-controlled slight pressure difference type of back pressure controller has the narrow difference in pressure range but performs the pressure control with high accuracy at a low error level of ±0.01 MPa. Thus, the back pressure controller is capable of controlling the gas supply pressure with high accuracy.

Although in FIG. 7 the case of supplying multiple types of gases have been described as in the second embodiment, one type of gas may be supplied as in the first embodiment. In addition, three or more back pressure controllers may be provided in a serial manner.

Fourth Embodiment

Next, a fourth embodiment will be described.

Figure 8:
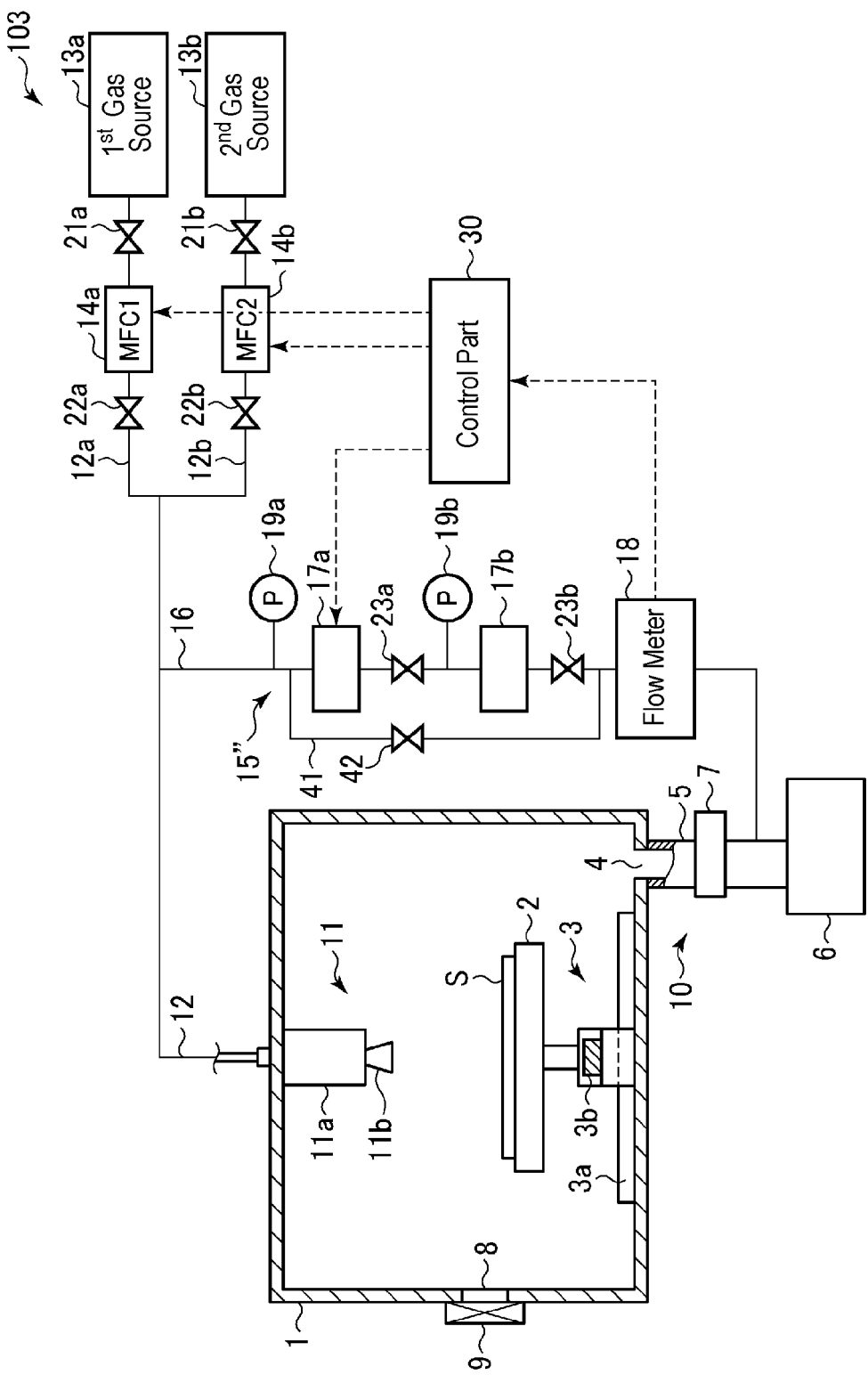
FIG. 8 is a cross-sectional view illustrating a gas cluster processing device according to a fourth embodiment of the present disclosure.

FIG. 8 is a cross-sectional view illustrating a gas cluster processing device according to the fourth embodiment of the present disclosure.

The basic configuration of a gas cluster processing device 103 of the fourth embodiment is the same as that of FIG. 7 of the third embodiment, but differs from that of FIG. 7 in that the pressure control part further includes a bypass pipe for bypassing the back pressure controllers and an opening/closing valve that opens/closes the bypass pipe.

As illustrated in FIG. 8, in the gas cluster processing device 103 of the present embodiment, in addition to all the components of the pressure control part 15' of the third embodiment illustrated in FIG. 7, a pressure control part 15" further includes a bypass pipe 41 and an opening/closing valve 42 provided in the bypass pipe 41. One end of the bypass pipe 41 is connected to a portion of the upstream side of the first back pressure controller 17a in the branch pipe 16, and the other end thereof is connected to a portion of the downstream side of the second back pressure controller 17b in the branch pipe 16, so that the bypass pipe 41 bypasses the first back pressure controller 17a and the second back pressure controller 17b.

In a case where the bypass pipe 41 and the opening/closing valve 42 are not provided, the gas remaining in the cluster nozzle 11 and the pipe is continuously ejected from the cluster nozzle 11 due to the pressure difference even if the gas supply is stopped after a substrate processing is completed. In general, the vacuum transfer chamber adjacent to the processing container 1 is maintained at a pressure lower than an internal pressure of the processing container 1. Thus, the internal pressure of the processing container 1 needs to be further reduced when unloading the substrate S, which further increases the pressure difference. This prolongs a time period until the ejection of the gas is actually stopped from the stop of the gas supply.

The unloading of the substrate S needs to be performed after the gas supply is ceased and after the ejection of the gas from the cluster nozzle 11 is stopped as described above. However, the prolonged gas ejection time increases a time of replacing the substrate with a new one after the substrate processing is completed, which adversely affects throughput of the substrate processing.

In contrast, in the present embodiment, the bypass pipe 41 and the opening/closing valve 42 are provided, and the opening/closing valve 42 is maintained in a closed state during the processing, and is opened after the processing is completed. In this configuration, the gas remaining in the cluster nozzle 11 and the pipe is quickly drawn by the exhaust mechanism 10 through the bypass pipe 41. This makes it possible to shorten a time period until the ejection of the gas from the cluster nozzle 11 is stopped after the gas supply is stopped, thus shortening the time of replacing the substrate.

In practice, when the gas supply pressure was set to 0.9 MPa and the bypass pipe and the opening/closing valve were not used, it took 12 seconds until the ejection of the gas from the cluster nozzle is stopped after the gas supply is stopped. In contrast, when the bypass pipe and the opening/closing valve were used, and after stopping the gas supply, the opening/closing valve was opened to draw the gas through the bypass pipe, the time period was shortened to 2 seconds, which is ⅙ of the above-mentioned time of 12 seconds.

Although in the gas cluster processing device 103 of FIG. 8, there is shown the case in which the bypass pipe and the opening/closing valve are added to the pressure control part of the gas cluster processing device 102 illustrated in FIG. 7, the bypass pipe and the opening/closing valve may be added to the gas cluster processing device 100 illustrated in FIG. 1 and the gas cluster processing device 101 illustrated in FIG. 6.

Fifth Embodiment

Next, a fifth embodiment will be described.

Figure 9:
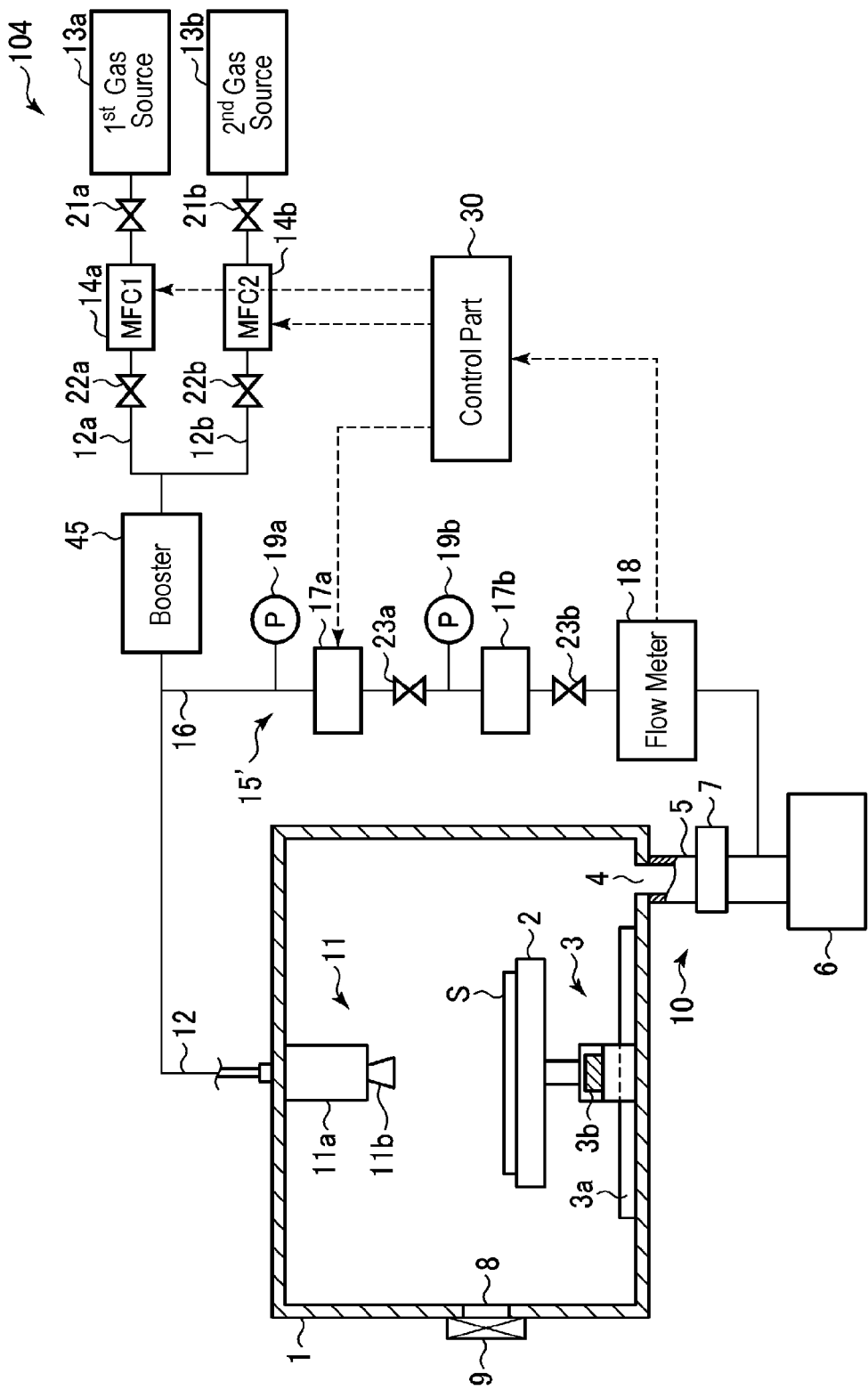
FIG. 9 is a cross-sectional view illustrating a gas cluster processing device according to a fifth embodiment of the present disclosure.

FIG. 9 is a cross-sectional view illustrating a gas cluster processing device according to the fifth embodiment of the present disclosure.

The basic configuration of a gas cluster processing device 104 of the fifth embodiment is the same as that of FIG. 7 of the third embodiment, but differs from that of FIG. 7 in that a booster is provided at the upstream side of a connection position at which the pressure control part is connected in the gas supply pipe.

As illustrated in FIG. 9, in the gas cluster processing device 104 of the present embodiment, a booster 45 is provided at the upstream side of a connection portion at which the pressure control part 15' is connected in the gas supply pipe 12, namely a connection portion at which the branch pipe 16 is connected to the gas supply pipe 12.

The booster 45 includes, for example, a gas booster, and is to increase a pressure of the gas supplied to the gas supply pipe 12. The booster 45 is effective in increasing the supply pressure of the gas supplied to the cluster nozzle 11.

However, in the case in which the gas supply pressure is controlled by controlling the gas supply flow rate using the mass flow controller as in the prior art, when the booster is used, a time period until a pressure of the booster 45 is stabilized is additionally taken. Thus, in addition to the time period taken until the amount of gas flowing out from the orifice of the cluster nozzle 11 and the amount of gas to be supplied are stabilized, the time period taken until the pressure of the booster 45 is stabilized, further prolongs the time period until the gas supply pressure reaches the set supply pressure.

In contrast, in the present embodiment, it is possible to control the gas supply pressure to reach the set supply pressure in a short period of time by controlling the gas supply pressure itself using the back pressure controller. This makes it possible to shorten the time period required for stabilizing the pressure of the booster 45. Thus, by providing the booster 45 in the present embodiment, it is possible to further enhance the effect of shortening the time period taken until the gas supply pressure reaches the set supply pressure from the start of the gas supply and is stabilized.

Although in the gas cluster processing device 104 of FIG. 9, there is shown the case in which the booster is added to the gas cluster processing device 102 illustrated in FIG. 7, the booster may be added to the gas cluster processing device 100 illustrated in FIG. 1, the gas cluster processing device 101 illustrated in FIG. 6, and the gas cluster processing device 103 illustrated in FIG. 8.

Sixth Embodiment

Next, a sixth embodiment will be described.

Figure 10:
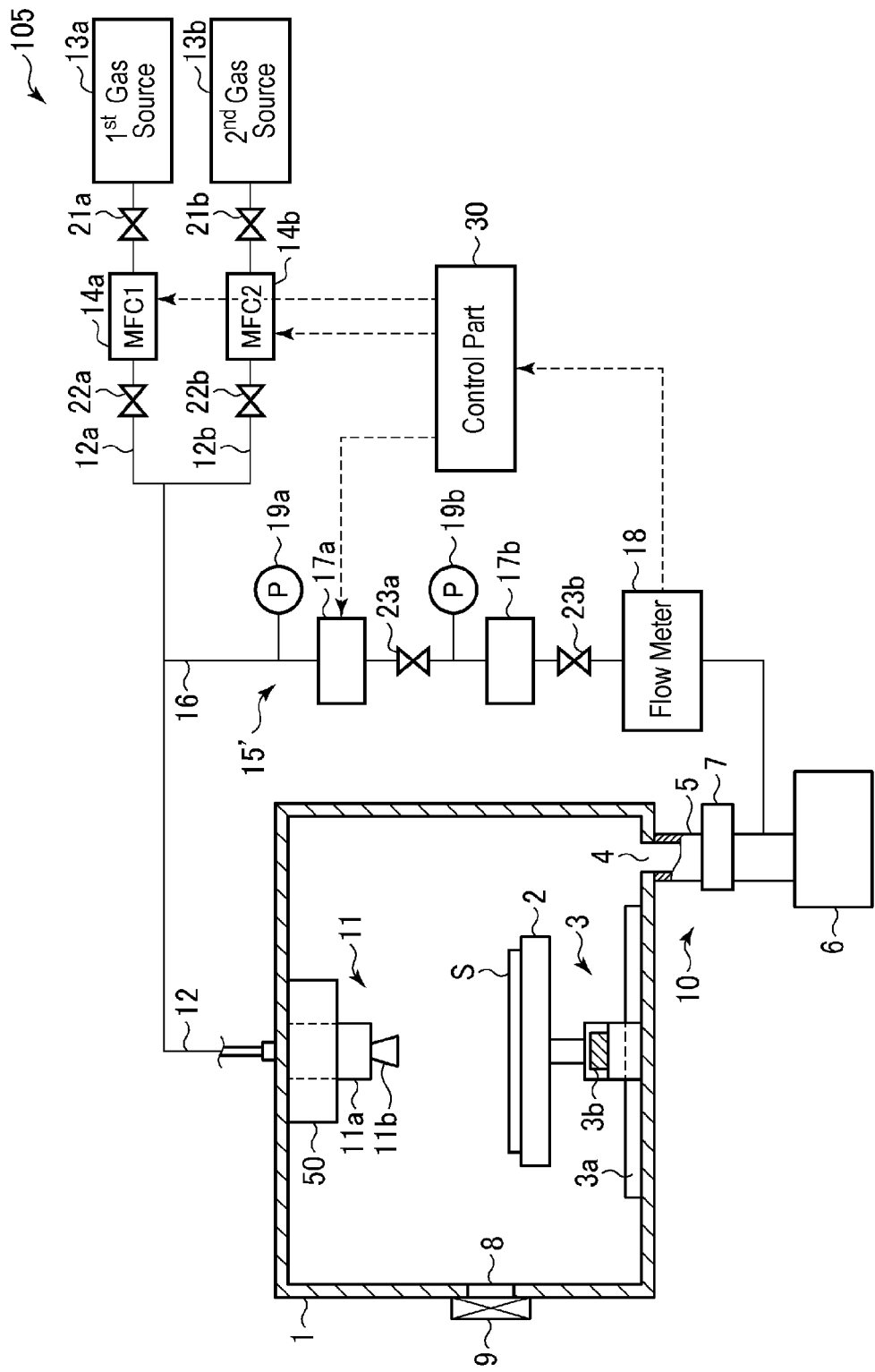
FIG. 10 is a cross-sectional view illustrating a gas cluster processing device according to a sixth embodiment of the present disclosure.

FIG. 10 is a cross-sectional view illustrating a gas cluster processing device according to the sixth embodiment of the present disclosure.

The basic configuration of a gas cluster processing device 105 of the sixth embodiment is the same as that of FIG. 7 of the third embodiment, but differs from that of FIG. 7 in that the gas cluster processing device 105 includes a temperature adjustment mechanism for adjusting a temperature of the cluster nozzle.

As illustrated in FIG. 10, in the gas cluster processing device 105 of the present embodiment, a temperature adjustment mechanism 50 is provided in the vicinity of the cluster nozzle 11. The temperature adjustment mechanism 50 is provided to adjust the temperature of the gas supplied to the cluster nozzle 11. It is possible to adjust the size of the gas cluster by heating or cooling the cluster generation gas using the temperature adjustment mechanism 50. Thereby, it is possible to effectively perform the cleaning process using the gas cluster.

When the temperature of the gas is adjusted by the temperature adjustment mechanism 50, a difference occurs between a temperature of the gas at the side of the gas source and a temperature of gas in the vicinity of the temperature adjustment mechanism 50 closest to the cluster nozzle 11. For example, when the temperature adjustment mechanism 50 cools down the gas, a flow rate of the gas passing through the orifice of the cluster nozzle 11 is increased. Accordingly, in this case, there is a possibility that a desired gas supply pressure may not be reached with a gas flow rate necessary for the cluster nozzle 11 to maintain the gas supply pressure that is set at normal temperature (not at the time of temperature adjustment). For this reason, in the case in which the gas supply pressure is controlled by controlling the gas supply flow rate using the mass flow controller as in the prior art, when the temperature of the cluster nozzle 11 is changed, it is necessary to set a gas flow rate adapted each time the temperature of the cluster nozzle 11 is changed. This becomes a factor to destabilize the gas supply pressure.

In contrast, in the present embodiment, the gas supply pressure for the cluster nozzle 11 is continuously controlled to be constant by the back pressure controllers. Thus, the gas can be stably supplied even if a fluctuation in temperature is caused by the temperature adjustment mechanism 50. In addition, even if the supply gas flow rate is insufficient or excessive, the measured value of the flowmeter 18 is fed back to the mass flow controllers 14a and 14b, which makes it possible to maintain the stable gas supply.

Although in the gas cluster processing device 105 of FIG. 10, there is shown the case in which the temperature adjustment mechanism is added to the gas cluster processing device 102 illustrated in FIG. 7, the temperature adjustment mechanism may be applied to the gas cluster processing device 100 illustrated in FIG. 1, the gas cluster processing device 101 illustrated in FIG. 6, the gas cluster processing device 103 illustrated in FIG. 8, and the gas cluster processing device 104 illustrated in FIG. 9.

Experimental Example

Next, an experimental example of the present disclosure will be described.

In this experimental example, the substrate processing using the gas cluster was performed by the gas cluster processing device 101 of FIG. 6, wherein the $CO_2$ gas was used as the cluster generation gas, and the $H_2$ gas or the He gas was used as the acceleration gas.

The substrate S was loaded into the processing container 1 in which the evacuation is being continuously performed by the vacuum pump 6. The primary-side pressure of the back pressure controller 17, namely the gas supply pressure, was set to 0.9 MPa. In this example, when the total flow rate required to reach the pressure of 0.9 MPa was 1,000 sccm and the ratio of the $CO_2$ gas to the $H_2$ gas or the He gas in flow rate was set to 1:1, required flow rates of the $CO_2$ gas and the $H_2$ gas or the He gas were 500 sccm in computation.

In Step 1, all the $CO_2$ gas and the $H_2$ gas or the He gas were supplied at a flow rate of 1,000 sccm, which exceeds the flow rate required to reach the pressure that corresponds to 0.9 MPa. In Step 2, the back pressure controller 17 was operated to stabilize the pressure and the cleaning process was performed at that time. After the cleaning process was started, the flow rate value measured by the flowmeter 18 was fed back to the mass flow controllers 14a and 14b in Step 3. The flow rate of the $CO_2$ gas and the flow rate of the $H_2$ gas or the He gas were controlled to fall within a range of more than 500 sccm to less than 1,000 sccm, which is enough to maintain the gas supply pressure at 0.9 MPa.

By performing the control as described above, it was possible to shorten the time period taken until the gas supply pressure reaches the set supply pressure from the start of the gas supply and is stabilized, in the range of 4 minutes or below. Thus, the gas supply pressure for the cluster nozzle 11 was maintained constant. It was possible to perform the stable substrate processing.

Figure 11:
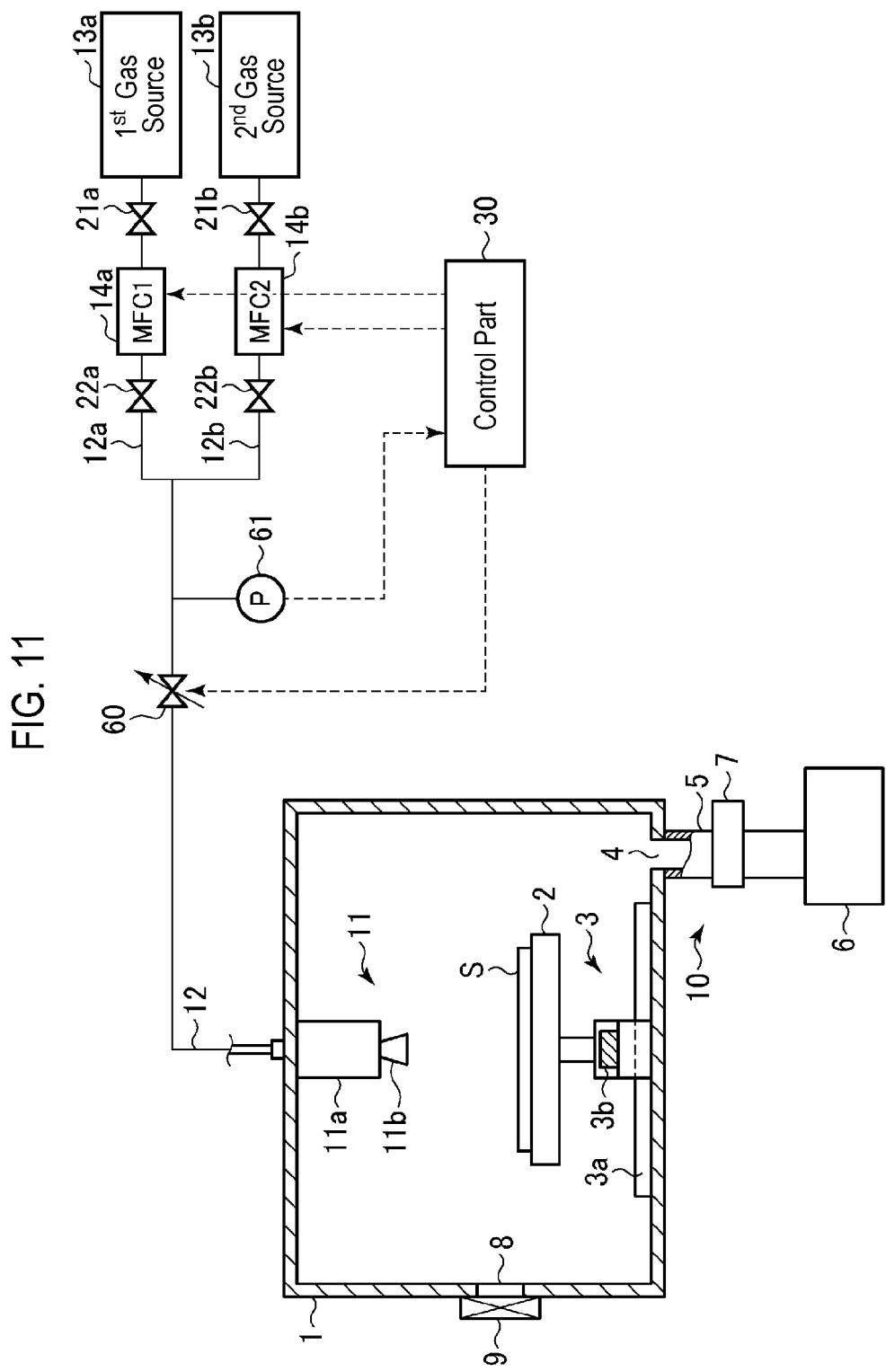
FIG. 11 is a cross-sectional view illustrating a conventional gas cluster processing device.

For comparison, a substrate processing using a gas cluster was performed using a gas cluster processing device which controls a gas supply pressure using a flow rate controlled by a mass flow controller. As illustrated in FIG. 11, the gas cluster processing device used for comparison includes two gas sources and two mass flow controllers, which are the same as those in FIG. 6, and a pressure control valve 60 provided in the gas supply pipe 12, instead of the pressure control part 15. Reference numeral 61 denotes a pressure gauge P. In FIG. 11, components which are the same as those of FIG. 6 are denoted by the same reference numerals. The $CO_2$ gas was used as a cluster generation gas, and the $H_2$ gas or the He gas was used as an acceleration gas.

The substrate S was loaded into the processing container 1 in which the evacuation is being continuously performed by the vacuum pump 6. The gas supply pressure was set to 0.9 MPa. In this example, since the total flow rate required to reach 0.9 MPa was 1,000 sccm in computation, the ratio of the $CO_2$ gas and the $H_2$ gas or the He gas in flow rate was set to 1:1, and the flow rates of both the $CO_2$ gas and the $H_2$ gas or the He gas were set to 500 sccm. The gases were supplied at such flow rates to control the gas supply pressure. The processing was performed after the gas supply pressure was stabilized. At this time, it took 15 minutes or more until the gas supply pressure is stabilized after the gases are supplied.

In order to shorten the time period required to stabilize the gas supply pressure, the flow rates of the $CO_2$ gas and the $H_2$ gas or the He gas were set to 1,000 sccm by the mass flow controllers at the start of gas supply, respectively. In this case, the time period taken to reach the set supply pressure was shortened, while the gas supply pressure overshot. In addition, the pressure at the downstream side of the mass flow controller was increased at the time of occurring the overshooting. As a result, a difference in pressure at the front and back sides of the mass flow controller was not obtained and a hunting phenomenon occurred in control. It was not possible to perform the flow rate control, so that the ratio of the gases was outside of a predetermined range.

From the above results, the effects of the present disclosure were confirmed.

<Other Applications>

While the embodiments of the present disclosure have been described above, the present disclosure is not limited to the above-described embodiments, and various modifications can be made within the scope of the present disclosure.

Although the case in which the substrate processing using the gas cluster is applied to the cleaning process of the substrate have been described in the above-mentioned embodiments, the present disclosure is not limited thereto. As an example, the substrate processing using the gas cluster may be applied to a process such as etching. In some embodiments, various embodiments described above may be implemented in an arbitrarily combination.

EXPLANATION OF REFERENCE NUMERALS

1: processing container, 2: stage, 3: drive part, 10: exhaust mechanism, 11: cluster nozzle, 12: gas supply pipe, 13, 13a, 13b: gas source, 14, 14a, 14b: mass flow controller, 15, 15', 15": pressure controller, 16: branch pipe, 17, 17a, 17b: back pressure controller, 18: flowmeter, 19, 19a, 19b: pressure gauge, 21, 22, 23, 23*a*, 23*b*, 42: opening/closing valve, 30: controller, 41: bypass pipe, 45: booster, 50: temperature adjustment mechanism, 100, 101, 102, 103, 104, 105: gas cluster processing device, S: substrate (workpiece)

What is claimed is:

1. A gas cluster processing device for performing a predetermined process on a workpiece by irradiating the workpiece with a gas cluster, comprising:
   a processing container in which the workpiece is disposed;
   a gas supply part configured to supply a gas for generating the gas cluster;
   a flow rate controller configured to control a flow rate of the gas supplied from the gas supply part;
   a cluster nozzle configured to receive the gas for generating the gas cluster at a predetermined supply pressure, spray the gas into the processing container maintained in a vacuum state, and convert the gas into the gas cluster through an adiabatic expansion;
   a pressure control part provided in a pipe between the flow rate controller and the cluster nozzle and including a back pressure controller configured to control a supply pressure of the gas for generating the gas cluster; and
   a controller configured to control a set flow rate of the flow rate controller,
   wherein the controller controls the set flow rate of the flow rate controller to a first flow rate exceeding a flow rate required for reaching the predetermined supply pressure until the supply pressure of the gas supplied from the gas supply part reaches the predetermined supply pressure, and
   wherein the pressure control part includes a flowmeter configured to measure a flow rate of a gas flowing through the back pressure controller, and
   wherein the controller controls, based on the measured value obtained by the flowmeter, the set flow rate of the flow rate controller to a second flow rate which is greater than a flow rate enough to maintain the predetermined supply pressure and less than the first flow rate.

2. The gas cluster processing device of claim 1, wherein the pressure control part comprises a branch pipe branched from the pipe, and further comprises as the back pressure controller, a first back pressure controller and a second back pressure controller which are provided in the branch pipe in a serial manner,
   wherein a high-precision back pressure controller having a relatively narrow pressure difference range is used as the first back pressure controller, and a primary-side pressure of the first back pressure controller is set to be a set value of the gas supply pressure, and
   wherein a back pressure controller having a pressure difference range wider than the pressure difference range of the first back pressure controller is used as the second back pressure controller, and a primary-side pressure of the second back pressure controller is set to be lower than the set value of the gas supply pressure.

3. The gas cluster processing device of claim 1, wherein the gas supply part is configured to separately supply at least two types of gases as the gas for generating the gas cluster,
   wherein the flow rate controller comprises at least two flow rate controllers provided respectively to correspond to the at least two types of gases, the at least two types of gases are joined in the pipe at downstream sides of the at least two flow rate controllers, and
   wherein the pressure control part is provided in a portion of the pipe in which the at least two types of gases are joined.

4. The gas cluster processing device of claim 1, further comprising: a booster provided at an upstream side of a portion of the pipe in which the pressure control part is provided, the booster being configured to increase a pressure of the gas for generating the gas cluster.

5. The gas cluster processing device of claim 1, wherein the pressure control part further comprises:
   a bypass flow path provided to bypass the back pressure controller from the pipe; and
   an opening/closing valve configured to open/close the bypass flow path,
   wherein, after the gas cluster is processed, the opening/closing valve is opened to exhaust the gas remaining in the cluster nozzle and the pipe through the bypass flow path.

6. The gas cluster processing device of claim 1, wherein the controller is configured to control the first flow rate to fall within a range of 1.5 times to 50 times the flow rate enough to maintain the predetermined supply pressure, and configured to control the second flow rate to fall within a range of 1.02 to 1.5 times the flow rate enough to maintain the predetermined supply pressure.

* * * * *